United States Patent
Li et al.

(10) Patent No.: US 8,906,248 B2
(45) Date of Patent: Dec. 9, 2014

(54) SILICON ON INSULATOR ETCH

(75) Inventors: Siyi Li, Fremont, CA (US); Robert C. Hefty, Fremont, CA (US); Mark Todhunter Robson, Danbury, CT (US); James R. Bowers, Brookfield, CT (US); Audrey Charles, Wappingers Falls, NY (US)

(73) Assignee: Lam Research Corporation, Fremont, CA (US)

( * ) Notice: Subject to any disclaimer, the term of this patent is extended or adjusted under 35 U.S.C. 154(b) by 125 days.

(21) Appl. No.: 13/324,895

(22) Filed: Dec. 13, 2011

(65) Prior Publication Data

US 2013/0149869 A1    Jun. 13, 2013

(51) Int. Cl.
*H01L 21/302* (2006.01)
*H01L 21/461* (2006.01)
*H01L 21/3213* (2006.01)
*H01L 21/311* (2006.01)

(52) U.S. Cl.
CPC .... *H01L 21/32137* (2013.01); *H01L 21/31116* (2013.01)
USPC .................................. 216/67; 216/63; 216/58

(58) Field of Classification Search
None
See application file for complete search history.

(56) References Cited

U.S. PATENT DOCUMENTS

| | | | |
|---|---|---|---|
| 3,679,502 A | 7/1972 | Hays | |
| 4,330,384 A * | 5/1982 | Okudaira et al. | 204/192.37 |
| 5,924,000 A | 7/1999 | Linliu et al. | |
| 6,037,266 A | 3/2000 | Tao et al. | |
| 6,232,209 B1 | 5/2001 | Fujiwara et al. | |
| 7,129,178 B1 | 10/2006 | Schwarz et al. | |
| 7,220,678 B2 | 5/2007 | Nozawa et al. | |
| 7,682,985 B2 | 3/2010 | Koemtzopoulos et al. | |
| 2004/0087092 A1 | 5/2004 | Huang et al. | |
| 2007/0170149 A1* | 7/2007 | Aramaki et al. | 216/58 |
| 2008/0038673 A1* | 2/2008 | Nagaiwa et al. | 430/313 |
| 2008/0169494 A1* | 7/2008 | Cheng et al. | 257/302 |
| 2009/0081878 A1 | 3/2009 | Dhindsa | |
| 2010/0213555 A1* | 8/2010 | Hargrove et al. | 257/411 |

FOREIGN PATENT DOCUMENTS

WO    WO 01/08209    2/2001

OTHER PUBLICATIONS

International Search Report dated May 9, 2013 from International Application No. PCT/IB2012/057128.
Written Opinion dated May 9, 2013 from International Application No. PCT/IB2012/057128.

* cited by examiner

*Primary Examiner* — Shamim Ahmed
*Assistant Examiner* — Bradford Gates
(74) *Attorney, Agent, or Firm* — Beyer Law Group LLP

(57) ABSTRACT

A method etching features through a stack of a silicon nitride layer over a silicon layer over a silicon oxide layer in a plasma processing chamber is provided. The silicon nitride layer is etched in the plasma processing chamber, comprising; flowing a silicon nitride etch gas; forming the silicon nitride etch gas into a plasma to etch the silicon nitride layer, and stopping the flow of the silicon nitride etch gas. The silicon layer is, comprising flowing a silicon etch gas, wherein the silicon etch gas comprises $SF_6$ or $SiF_4$, forming the silicon etch gas into a, and stopping the flow of the silicon etch gas. The silicon oxide layer is etched in the plasma processing chamber, comprising flowing a silicon oxide etch gas, forming the silicon oxide etch gas into a plasma, and stopping the flow of the silicon oxide etch gas.

16 Claims, 7 Drawing Sheets

SILICON ON INSULATOR ETCH

BACKGROUND OF THE INVENTION

The present invention relates to etching a silicon layer through a mask during the production of a semiconductor device. More specifically, the present invention relates to a silicon on insulator layer.

During semiconductor wafer processing, features may be etched into a stack of a silicon nitride layer over a silicon layer over a silicon oxide layer.

SUMMARY OF THE INVENTION

To achieve the foregoing and in accordance with the purpose of the present invention, a method for etching features through a stack of a silicon nitride or silicon carbide layer over a silicon layer over a silicon oxide layer in a plasma processing chamber is provided. The silicon nitride or silicon carbide layer is etched in the plasma processing chamber, comprising; flowing a silicon nitride or silicon carbide etch gas into the plasma processing chamber; forming the silicon or nitride silicon carbide etch gas into a plasma to etch the silicon nitride layer, and stopping the flow of the silicon nitride or silicon carbide etch gas. The silicon layer is etched in the plasma processing chamber, comprising flowing a silicon etch gas into the plasma processing chamber that is different than the silicon nitride etch gas and wherein the silicon etch gas comprises $SF_6$ or $SiF_4$, forming the silicon etch gas into a plasma to etch the silicon layer, and stopping the flow of the silicon etch gas. The silicon oxide layer is etched in the plasma processing chamber, comprising flowing a silicon oxide etch gas into the plasma processing chamber that is different than the silicon etch gas, forming the silicon oxide etch gas into a plasma to etch the silicon oxide layer, and stopping the flow of the silicon oxide etch gas.

In another manifestation of the invention, a method for etching features through a stack of a silicon nitride or silicon carbide layer over a silicon layer over a silicon oxide layer in a plasma processing chamber is provided. The stack is placed in the plasma processing chamber with at least one capacitively coupled antenna. The silicon nitride or silicon carbide layer is etched in the plasma processing chamber, comprising flowing a silicon nitride or silicon carbide etch gas into the plasma processing chamber, forming the silicon nitride or silicon carbide etch gas into a plasma to etch the silicon nitride layer using power from the at least one capacitively coupled antenna, and stopping the flow of the silicon nitride or silicon carbide etch gas. The silicon layer is etched in the plasma processing chamber, comprising flowing a silicon etch gas into the plasma processing chamber that is different than the silicon nitride etch gas and wherein the silicon etch gas comprises at least one of $SF_6$ or $SiF_4$ and at least one of $CH_3F$, or $CH_2F_2$ or $CH_4$ and at least one of Ar or $N_2$, forming the silicon etch gas into a plasma to etch the silicon layer using power from the at least one capacitively coupled antenna, and stopping the flow of the silicon etch gas. The silicon oxide layer is etched in the plasma processing chamber, comprising flowing a silicon oxide etch gas into the plasma processing chamber that is different than the silicon etch gas, forming the silicon oxide etch gas into a plasma to etch the silicon oxide layer using power from the at least one capacitively coupled antenna, and stopping the flow of the silicon oxide etch gas. The stack is removed from the plasma processing chamber These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In creating semiconductor devices using silicon-on-insulator (SOI), a stack with a silicon nitride or silicon carbide layer over a silicon layer over a silicon oxide layer is etched. It is desirable to etch such features with vertical walls.

Figure 1:
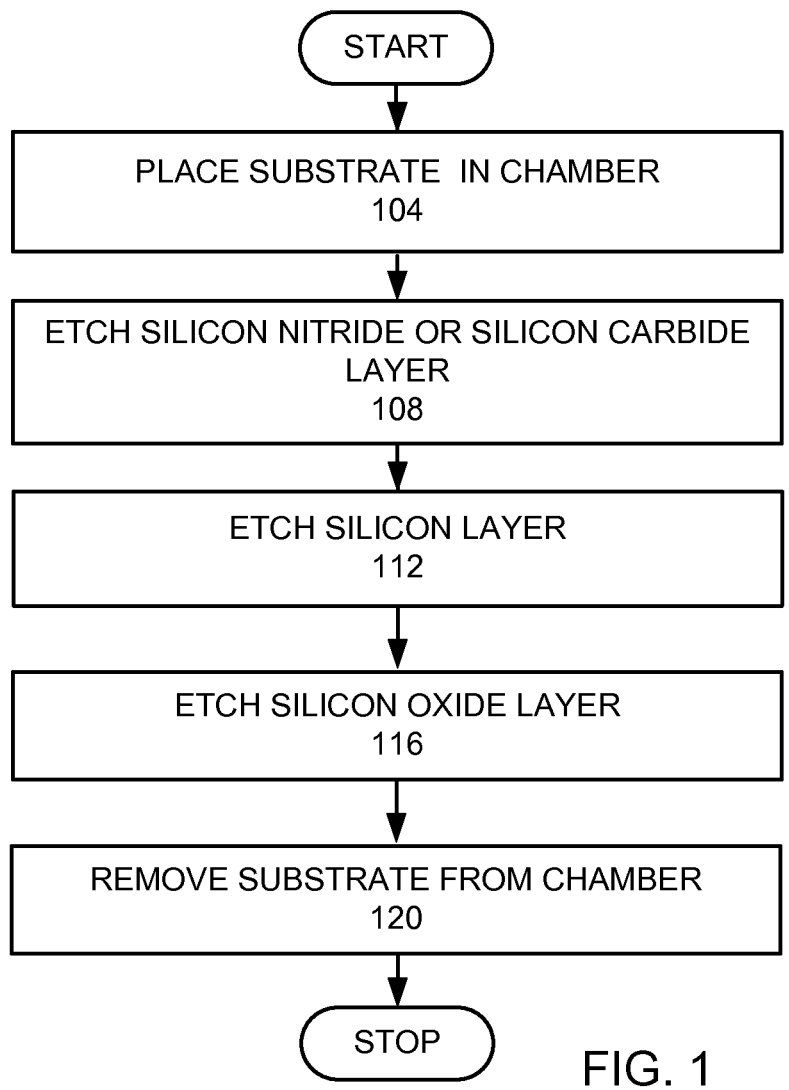
FIG. 1 is a high level flow chart of an embodiment of the invention.

To facilitate understanding, FIG. 1 is a high level flow chart of a process used in an embodiment of the invention. A substrate with a stack of a silicon nitride or silicon carbide layer over a silicon layer over a silicon oxide based layer is placed in a chamber, such as a plasma processing chamber (step 104). The silicon nitride or silicon carbide layer is etched (step 108). The silicon layer is etched (step 112). The silicon oxide layer is etched (step 116). The substrate is removed from the plasma processing chamber (step 120).

EXAMPLES

Figure 2A:
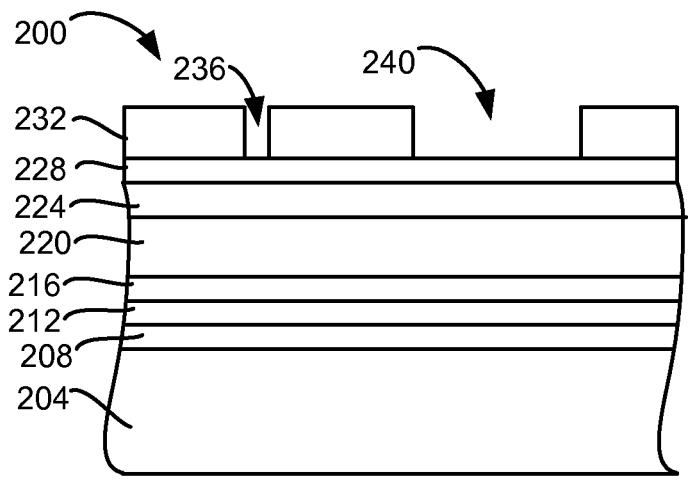
FIGS. 2A-E are schematic views of a stack processed according to an embodiment of the invention.

In an example of the invention, a substrate is placed in a plasma processing chamber (step 104). FIG. 2A is a cross-sectional view of a stack 200 with a substrate 204 over which a buried oxide layer (BOX) 208 is formed, over which a silicon-on-insulator (SOI) layer 212 is placed, over which a silicon nitride layer 216 is placed, over which a silicon oxide layer 220 is placed, over which an organic layer 224 is placed, over which an antireflective coating (ARC) 228 is placed over which a patterned photoresist mask 232 is placed. In this example, the patterned photoresist mask 232 has a narrow feature 236 and a wide feature 240.

Figure 3:
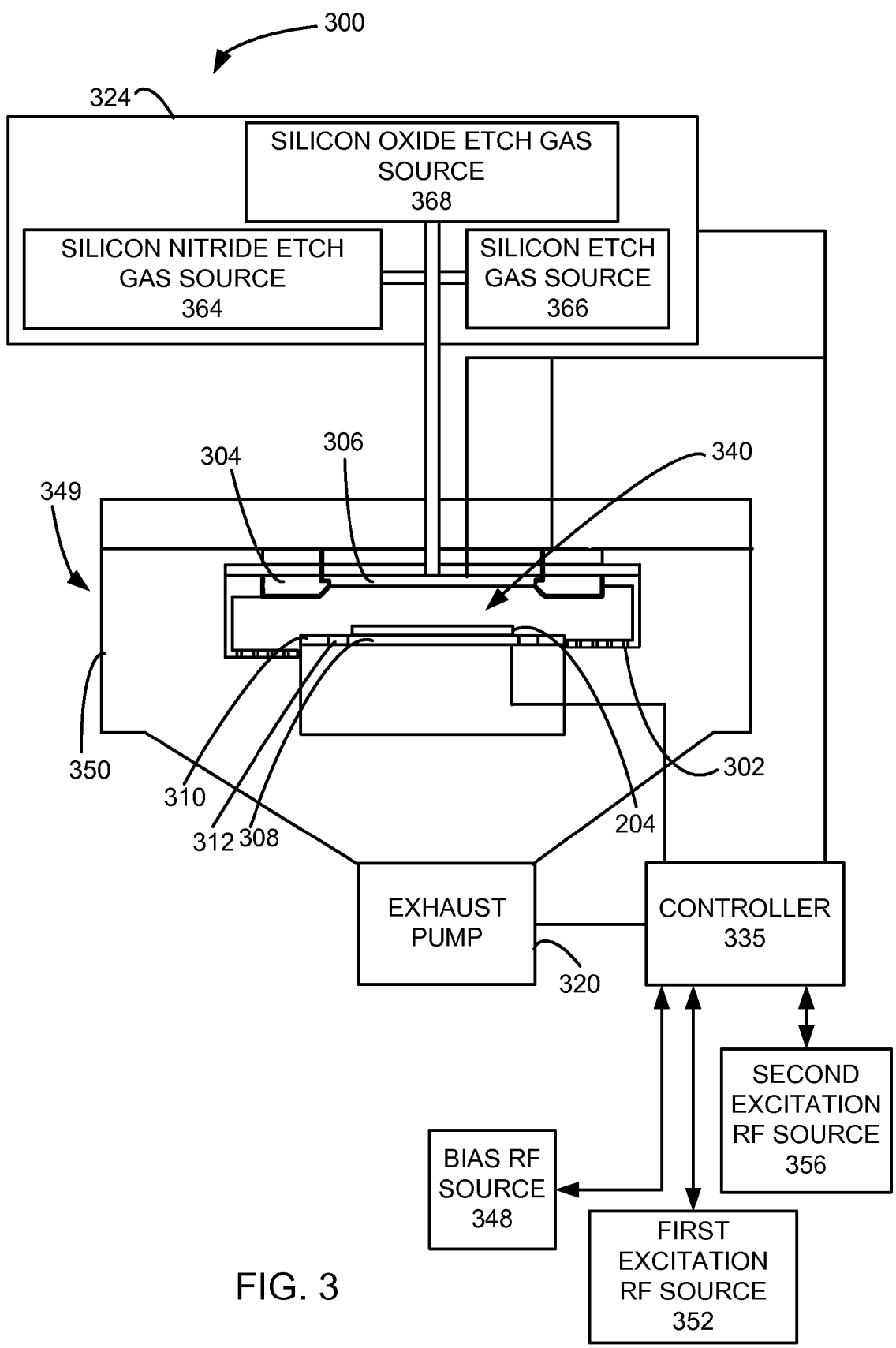
FIG. 3 is a schematic view of an etch reactor that may be used for etching.

FIG. 3 is a schematic view of an etch reactor that may be used in practicing the invention. In one or more embodiments of the invention, an etch reactor 300 comprises a top central electrode 306, top outer electrode 304, bottom central electrode 308, and a bottom outer electrode 310, within a plasma processing chamber 349, enclosed by a chamber wall 350. A bottom insulator ring 312 insulates the bottom central electrode 308 from the bottom outer electrode 310. Also within the plasma processing chamber 349, the substrate 204 is positioned on top of the bottom central electrode 308. The bottom central electrode 308 provides an electrostatic chuck (ESC) for holding the substrate 204.

A gas source 324 is connected to the plasma processing chamber 349 and supplies the etch gas into a plasma region 340 of the plasma processing chamber 349 during the etch processes. In this example, the gas source 324 comprises a silicon nitride etch gas source 364, a silicon etch gas source 366, and a silicon oxide etch gas source 368.

A bias RF source 348, a first excitation RF source 352, and a second excitation RF source 356 are electrically connected to the plasma processing chamber 349 through a controller 335 to provide power to the electrodes 304, 306, 308, and 310. The bias RF source 348 generates bias RF power and supplies the bias RF power to the plasma processing chamber 349. In this example, the bias RF power has a frequency of 2 MHz. The first excitation RF source 352 generates source RF power and supplies the source RF power to the plasma processing chamber 349. In this example, this source RF power has a frequency of 27 MHz. The second excitation RF source 356 generates another source RF power and supplies the source RF power to the plasma processing chamber 349, in addition to the RF power generated by the first excitation RF source 352. In this example, this source RF power has a frequency of 60 MHz.

The different RF signals may be supplied to various combinations of the top and bottom electrodes. Preferably, the lowest frequency of the RF should be applied through the bottom electrode on which the material being etched is placed, which in this example is the bottom central electrode 308. In this example, the top electrodes are grounded and power is only provided to the bottom central electrode 308.

The controller 335 is connected to the gas source 324, the bias RF source 348, the first excitation RF source 352, and the second excitation RF source 356. The controller 335 controls the flow of the etch gas into the plasma processing chamber 349, as well as the generation of the RF power from the three RF sources 348, 352, 356, the electrodes 304, 306, 308, and 310, and the exhaust pump 320.

The top central electrode 306 also serves as a gas distribution plate, which is connected to the gas source 324, and serves as a gas inlet for gas from the gas source 324. The exhaust pump serves as a gas outlet removing gas, which passes from the top central electrode 306 through the plasma region 340 through apertures 302 to the exhaust pump 320.

A Flex EX® dielectric etch system made by Lam Research Corporation™ of Fremont, Calif. may be used in a preferred embodiment of the invention.

Figure 4:
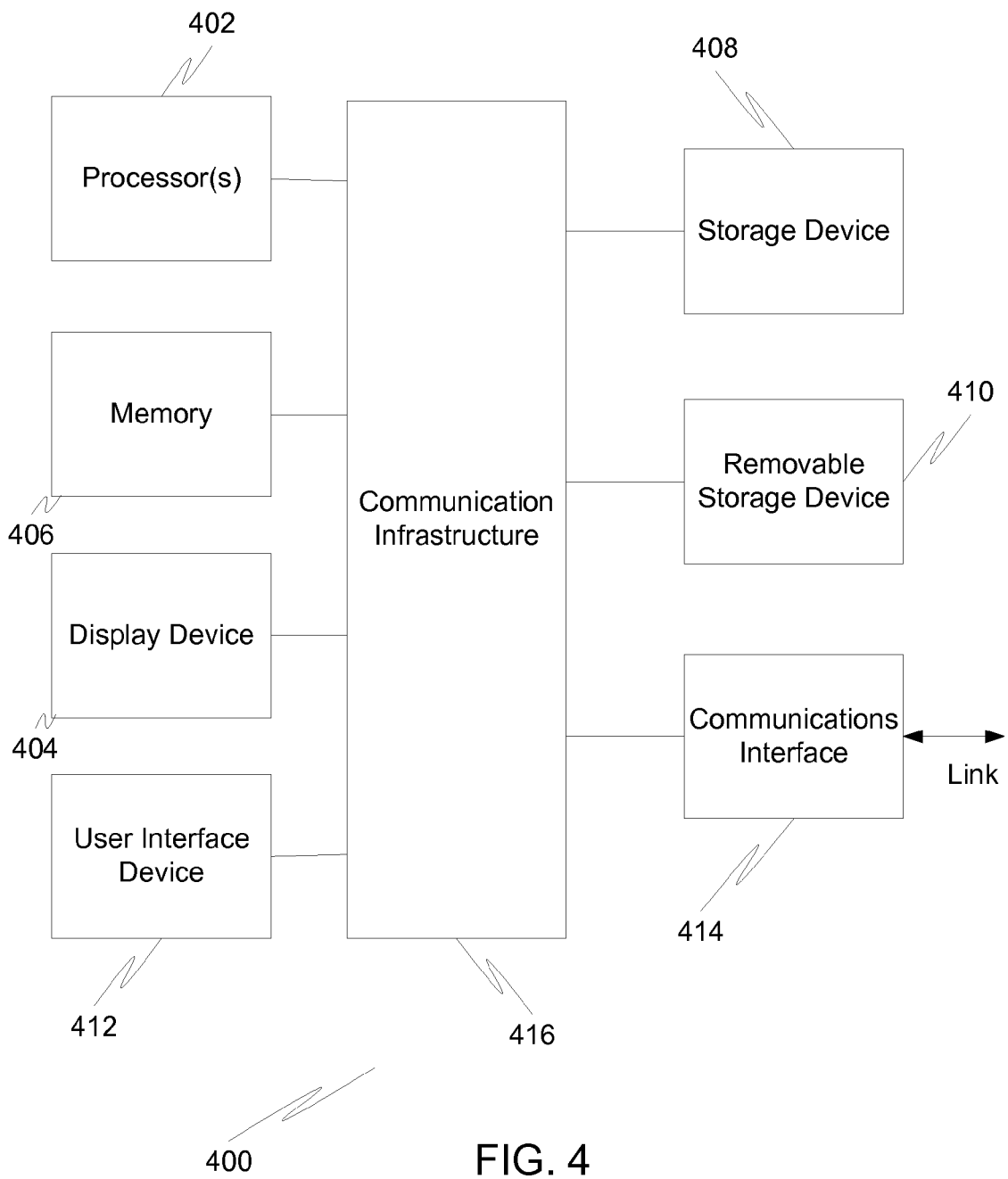
FIG. 4 illustrates a computer system, which is suitable for implementing a controller used in embodiments of the present invention.

FIG. 4 is a high level block diagram showing a computer system 400, which is suitable for implementing a controller 335 used in embodiments of the present invention. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
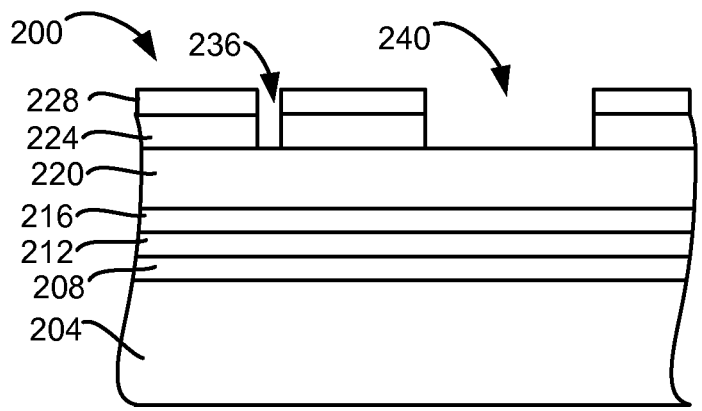

In this example, various steps are performed to etch the ARC layer 228, the organic layer 224, and the silicon oxide 220 layer. Such steps may be performed before the substrate is placed in the plasma processing chamber 300 or while the substrate is in the plasma processing chamber 300. In this example, an organic layer open step within the plasma processing chamber etches the ARC layer 228 and the organic layer 224. FIG. 2B is a cross sectional view of the stack 200 after features 236, 240 have been etched into the organic layer 224 and ARC layer 228.

Figure 5:
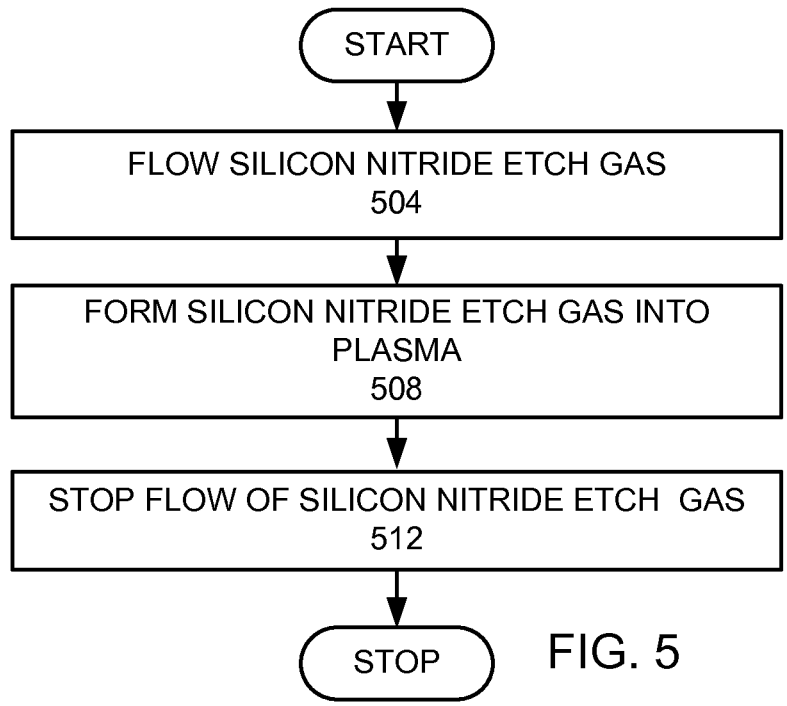
FIG. 5 is a more detailed flow chart of the silicon nitride or silicon carbide etch step.

The silicon nitride layer 216 is etched (step 108). In this example, the silicon oxide layer 220 and the silicon nitride layer 216 are etched in the same step. In addition, about half of the silicon layer 212 is etched during this step. FIG. 5 is a more detailed flow chart of the step of etching the silicon nitride layer (step 108). A silicon nitride or silicon carbide etch gas is flowed into the plasma processing chamber 349 from the silicon nitride etch gas source 364 (step 504). The silicon nitride or silicon carbide etch gas is formed into a plasma (step 508). After the etching is complete, the flow of the silicon nitride or silicon carbide etch gas is stopped (step 512).

An example of a recipe for the silicon nitride layer etch provides a pressure of 15 mTorr. A silicon nitiride etch gas of 38 sccm $O_2$, 10 sccm $C_4F_8$, and 70 sccm $CH_2F_2$ is flowed from the silicon nitride etch gas source 364 into the plasma processing chamber 349. The etch gas is transformed into a plasma by providing 900 watts at 27 MHz and 4500 watts at 2 MHz. The process is maintained for 30 seconds.

Generally the silicon nitride and silicon carbide etch gas is essentially free of $SF_6$ and $SiF_4$.

Figure 2C:
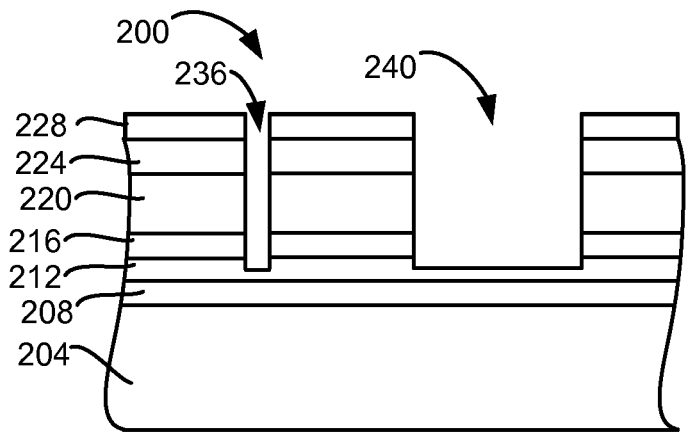

FIG. 2C is a cross sectional view of the stack 200 after the silicon nitride etch in this example. As can be seen, the silicon oxide layer 220 and silicon nitride layer 216 are completely etched, and about half of the silicon layer 212 is etched. In another example, most of the silicon layer 212 is etched during the silicon nitride etch.

Figure 6:
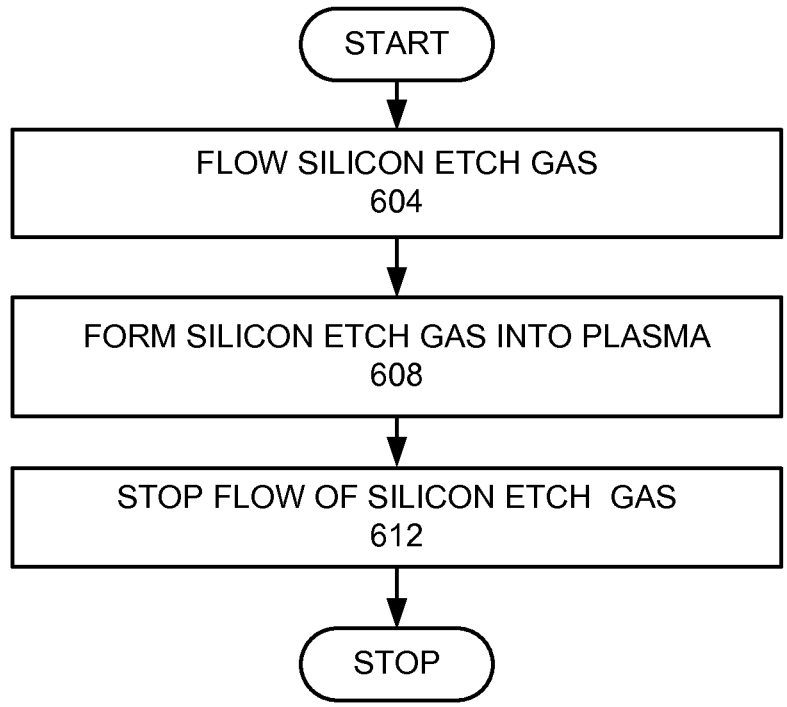
FIG. 6 is a more detailed flow chart of the silicon etch step.

The silicon layer 212 is etched (step 112). In this step, the etch of the silicon layer 212 is completed. FIG. 6 is a more detailed flow chart of the silicon layer etch (step 112). A silicon etch gas is flowed into the plasma processing chamber 349 from the silicon etch gas source 366 (step 604). The silicon etch gas is formed into a plasma (step 608). After the etching is complete, the flow of the silicon etch gas is stopped (step 612).

An example of a recipe for the silicon layer etch a pressure of 15 mTorr is provided. A silicon etch gas of 150 sccm $N_2$, 75 sccm $CH_2F_2$ and 30 $SF_6$ is flowed into the plasma processing chamber 349 from the silicon etch gas source 366. The silicon etch gas is transformed into a plasma by providing 300 watts at 60 MHz, 900 watts at 27 MHz, and 1500 watts at 2 MHz. The process is maintained for 30 seconds.

The silicon etch gas is different from the silicon nitride or silicon carbide etch gas. In addition, the silicon etch gas comprises $SF_6$ or $SiF_4$. More preferably, the silicon etch gas further comprises a hydrocarbon. A hydrocarbon is a molecule of carbon and hydrogen and may or may not have fluorine. More preferably the hydrocarbon is one of $CH_3F$, or $CH_2F_2$ or $CH_4$. More preferable, the silicon etch gas further comprises Ar or $N_2$. The pressure may be in the range of 5 mTorr to 100 mTorr.

Figure 2D:
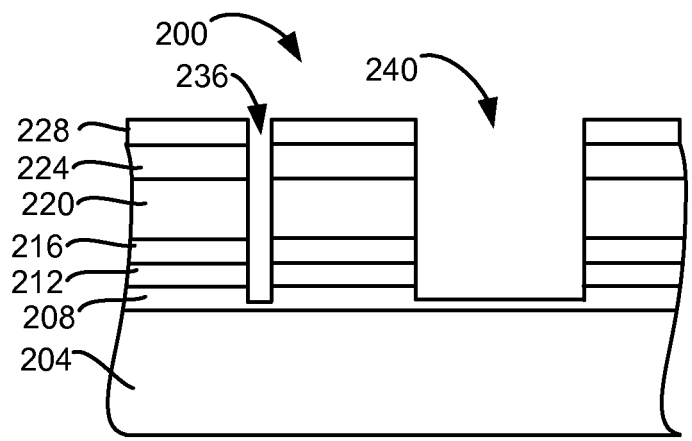

FIG. 2D is a cross sectional view of the stack 200 after the silicon etch in this example. As can be seen the remaining silicon layer 212 and at least half of the buried silicon oxide layer 208 is etched.

Figure 7:
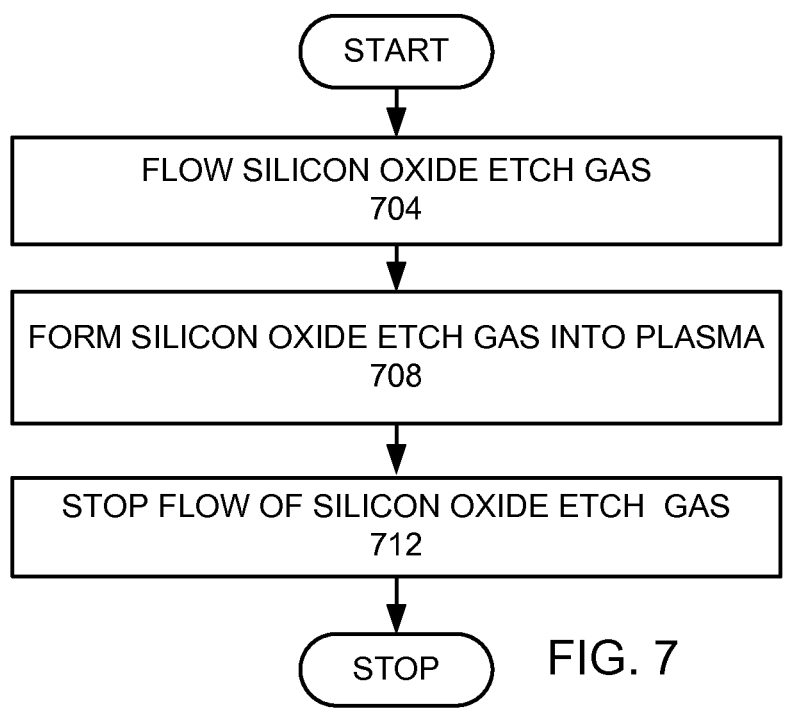
FIG. 7 is a more detailed flow chart of the silicon oxide etch step.

The buried silicon oxide layer 208 is etched (step 116). In this example, the remaining buried silicon oxide layer 208 is etched. FIG. 7 is a more detailed flow chart of the step of etching the silicon oxide layer (step 116). A silicon oxide etch gas is flowed into the plasma processing chamber 349 from the silicon oxide etch gas source 368 (step 704). The silicon oxide etch gas is formed into a plasma (step 708). After the etching is complete, the flow of the silicon oxide etch gas is stopped (step 712).

An example of a recipe for the silicon oxide layer etch a pressure of 16 mTorr is provided. A silicon oxide etch gas of 16 sccm $C_4F_6$, 23 sccm $O_2$, 32 sccm $C_4F_8$, and 300 sccm Ar is flowed from the silicon oxide etch gas source 368 into the plasma processing chamber 349. The silicon oxide etch gas is transformed into a plasma by providing 0 watts at 60 MHz, 900 watts at 27 MHz, and 4500 watts at 2 MHz. The process is maintained for 50 seconds.

Generally the silicon oxide etch gas is essentially free of $SF_6$ and $SiF_4$.

Figure 2E:
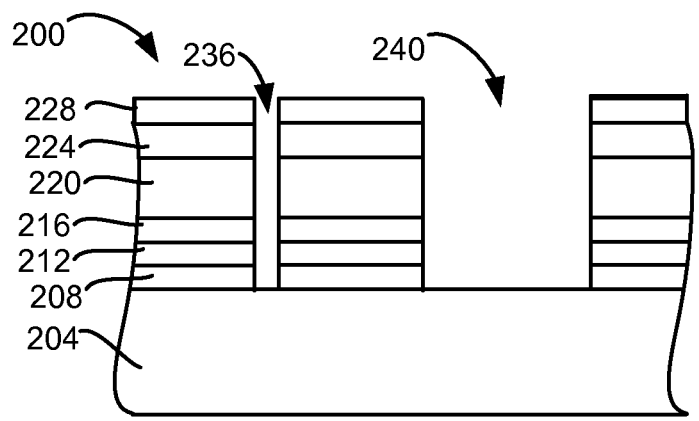

FIG. 2E is a cross sectional view of the stack 200 after the silicon oxide etch in this example. As can be seen the buried silicon oxide layer is completely etched. In this example, some of the substrate, which may be a doped silicon substrate, may also be etched.

It has been unexpectedly found that using a multistep etch where the first step does not use $SF_6$ or $SiF_4$ to etch a stack with a silicon nitride or silicon carbide layer over silicon over a silicon oxide provides vertical profiles without aspect ratio dependent etching. Generally, the silicon nitride or silicon carbide etch provides more polymerization, where the silicon etch provides less polymerization, a faster silicon etch rate, a higher etch selectivity and less profile bowing and less taper.

The amount of the silicon layer etched by the silicon nitride or silicon carbide etch depends on the etch budget or the amount of the mask available for removal. The silicon nitride etch recipe is more selective to the mask than the silicon etch recipe.

When an etch was performed according to the prior art, where only a single step was used, a feature etched to a 90 nm depth was found to be 7 nm larger at the top than at the bottom. By providing multiple steps, the taper was reduced so that the 90 nm feature was found to be less than 2 nm larger at the top than at the bottom.

In various embodiments, the inventive method provides 89° to 90° vertical sidewalls through all of the layers of a stack of silicon nitride or silicon carbide, silicon, and silicon oxide. In addition, the inventive method allows for the forming of both narrow and wide features together with the vertical sidewalls.

The invention also allows the etching of the different dielectric and silicon layers in a single capacitively coupled device instead of etching the dielectric layers in one chamber and the silicon layer in another layer, while still providing a fast etch rate and vertical sidewalls. The invention also allows the formation of features with a width of less than 22 nm.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for etching features through a stack of a silicon nitride or silicon carbide layer over a silicon layer over a silicon oxide layer in a plasma processing chamber, comprising:

etching the silicon nitride or silicon carbide layer in the plasma processing chamber, wherein the silicon nitride or silicon carbide layer is disposed below a silicon oxide layer, the etching comprising:
flowing a silicon nitride or silicon carbide etch gas into the plasma processing chamber;
forming the silicon nitride or silicon carbide etch gas into a plasma to etch the silicon nitride or silicon carbide layer; and
stopping the flow of the silicon nitride or silicon carbide etch gas;
etching the silicon layer positioned directly below the silicon nitride or silicon carbide in the plasma processing chamber, comprising:
flowing a silicon etch gas into the plasma processing chamber that is different than the silicon nitride or silicon carbide etch gas and wherein the silicon etch gas comprises $SF_6$ or $SiF_4$;
forming the silicon etch gas into a plasma to etch the silicon layer; and
stopping the flow of the silicon etch gas; and
etching the silicon oxide layer positioned below the silicon layer that is below the silicon nitride or silicon carbide layer in the plasma processing chamber, comprising:
flowing a silicon oxide etch gas into the plasma processing chamber that is different than the silicon etch gas;
forming the silicon oxide etch gas into a plasma to etch the silicon oxide layer; and
stopping the flow of the silicon oxide etch gas, wherein the etching the silicon nitride or silicon carbide layer etches most of the silicon layer.

2. The method, as recited in claims 1, wherein the silicon etch gas further comprises $CH_3F$, or $CH_2F_2$ or $CH_4$.

3. The method, as recited in 2, wherein the silicon etch gas further comprises Ar or $N_2$.

4. The method, as recited in claim 3, further comprising providing a pressure between 5 mTorr and 100 mTorr.

5. The method, as recited in claim 4, wherein the steps of forming the silicon nitride etch gas into a plasma, forming the silicon etch gas into a plasma, and forming the silicon oxide etch gas into a plasma uses a capacitively coupled RF signal to provide energy.

6. The method, as recited in claim 5, wherein the silicon nitride or silicon carbide layer etch gas comprises a fluorocarbon and a hydrofluorocarbon and is essentially $SF_6$ and $SiF_4$ free.

7. The method, as recited in claim 5, further comprising:
placing the stack in the plasma processing chamber before etching the silicon nitride or silicon carbide layer; and
removing the stack from the plasma processing chamber after etching the silicon oxide layer positioned below the silicon layer that is below the silicon nitride or silicon carbide layer, wherein the etching the silicon nitride or silicon carbide layer, the etching the silicon layer, and the etching the silicon oxide layer positioned below the silicon layer that is below the silicon nitride or silicon carbide layer are done in situ.

8. The method, as recited in claim 1, further comprising providing a pressure between 5 mTorr and 100 mTorr.

9. The method, as recited in claim 1, wherein the steps of forming the silicon nitride etch gas into a plasma, forming the silicon etch gas into a plasma, and forming the silicon oxide etch gas into a plasma uses a capacitively coupled RF signal to provide energy.

10. The method, as recited in claim 1, wherein the silicon etch gas further comprises a hydrocarbon that does not include flourine.

11. The method, as recited in claim 1, wherein the silicon etch gas further comprises $CH_4$.

12. The method, as recited in claim 1, wherein the silicon nitride or silicon carbide layer comprises only a silicon carbide layer, and wherein the silicon nitride or silicon carbide etch gas comprises on a silicon carbide etch gas.

13. The method, as recited in claim 1, wherein the silicon oxide layer and the silicon nitride or silicon carbine layer disposed below the silicon oxide layer are etched in a single step.

14. A method for etching features through a stack of a silicon nitride or silicon carbide layer over a silicon layer over a silicon oxide layer in a plasma processing chamber, comprising:
placing the stack in the plasma processing chamber with at least one capacitively coupled antenna;
etching the silicon nitride or silicon carbide layer in the plasma processing chamber, wherein the silicon nitride or silicon carbide layer is disposed below a silicon oxide layer, the etching comprising:
flowing a silicon nitride or silicon carbide etch gas into the plasma processing chamber;
forming the silicon nitride or silicon carbide etch gas into a plasma to etch the silicon nitride layer using power from the at least one capacitively coupled antenna; and
stopping the flow of the silicon nitride or silicon carbide etch gas;
etching the silicon layer positioned directly below the silicon nitride or silicon carbide in the plasma processing chamber, comprising:
flowing a silicon etch gas into the plasma processing chamber that is different than the silicon nitride or silicon carbide etch gas and wherein the silicon etch gas comprises at least one of $SF_6$ or $SiF_4$ and at least one of $CH_3F$, or $CH_2F_2$ or $CH_4$ and at least one of Ar or $N_2$;
forming the silicon etch gas into a plasma to etch the silicon layer using power from the at least one capacitively coupled antenna; and
stopping the flow of the silicon etch gas;
etching the silicon oxide layer positioned below the silicon layer that is below the silicon nitride or silicon carbide layer in the plasma processing chamber, comprising:
flowing a silicon oxide etch gas into the plasma processing chamber that is different than the silicon etch gas;
forming the silicon oxide etch gas into a plasma to etch the silicon oxide layer using power from the at least one capacitively coupled antenna; and
stopping the flow of the silicon oxide etch gas; and
removing the stack from the plasma processing chamber, wherein the etching the silicon nitride or silicon carbide layer etches most of the silicon layer.

15. The method, as recited in claim 14, wherein the silicon oxide layer and the silicon nitride or silicon carbine layer disposed below the silicon oxide layer are etched in a single step.

16. The method, as recited in claim 14, wherein the silicon layer is a silicon-on-insulator layer.

* * * * *